United States Patent
Xie et al.

(10) Patent No.: US 11,211,291 B2
(45) Date of Patent: Dec. 28, 2021

(54) VIA FORMATION WITH ROBUST HARDMASK REMOVAL

(71) Applicant: INTERNATIONAL BUSINESS MACHINES CORPORATION, Armonk, NY (US)

(72) Inventors: Ruilong Xie, Niskayuna, NY (US); Christopher J. Waskiewicz, Rexford, NJ (US); Kangguo Cheng, Schenectady, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/839,863

(22) Filed: Apr. 3, 2020

(65) Prior Publication Data
US 2021/0313229 A1    Oct. 7, 2021

(51) Int. Cl.
*H01L 21/768*    (2006.01)
*H01L 23/522*    (2006.01)
*H01L 23/528*    (2006.01)

(52) U.S. Cl.
CPC .. *H01L 21/76897* (2013.01); *H01L 21/76816* (2013.01); *H01L 21/76831* (2013.01); *H01L 21/76843* (2013.01); *H01L 23/5226* (2013.01); *H01L 23/5283* (2013.01)

(58) Field of Classification Search
CPC ......... H01L 21/76897; H01L 21/76834; H01L 21/76877; H01L 21/76885; H01L 21/76831; H01L 21/76883; H01L 23/5283; H01L 23/53295
See application file for complete search history.

(56) References Cited

U.S. PATENT DOCUMENTS

| | | | |
|---|---|---|---|
| 5,942,801 A * | 8/1999 | Tran ................ | H01L 21/76801 257/758 |
| 6,548,853 B1 * | 4/2003 | Hwang ............. | H01L 27/10817 257/306 |
| 9,312,222 B2 * | 4/2016 | Ting ................ | H01L 21/76883 |
| 10,177,028 B1 | 1/2019 | LiCausi et al. | |

(Continued)

OTHER PUBLICATIONS

Briggs et al., "Fully Aligned via Integration for Extendibility of Interconnects to Beyond the 7 nm Node", 2017 International Electron Devices Meeting. Dec. 2, 2017. pp. 1-4.

(Continued)

*Primary Examiner* — Zandra V Smith
*Assistant Examiner* — John M Parker
(74) *Attorney, Agent, or Firm* — Tutunjian & Bitetto, P.C.; L. Jeffrey Kelly

(57) ABSTRACT

A semiconductor device includes a base structure including a first interlayer dielectric (ILD) layer and a contact including a conductive liner disposed along a conductive core, a conductive plug disposed on the conductive liner between the conductive core and the first ILD layer to a height of the base structure, and a metallization level including a conductive line and a self-aligned via underneath the conductive line disposed on the contact and the conductive plug. The conductive plug protects underlying material and increases connectivity between the self-aligned via and the contact that was reduced due to misalignment.

15 Claims, 10 Drawing Sheets

(56) References Cited

U.S. PATENT DOCUMENTS

| | | | |
|---|---|---|---|
| 10,204,830 B2 | 2/2019 | Wallace et al. | |
| 10,297,467 B2 | 5/2019 | Wallace et al. | |
| 10,312,139 B2* | 6/2019 | Tsai | H01L 23/5283 |
| 10,312,188 B1 | 6/2019 | Srivastava et al. | |
| 10,727,123 B2* | 7/2020 | Lai | H01L 23/5226 |
| 2003/0038371 A1* | 2/2003 | Hsue | H01L 23/53223 |
| | | | 257/762 |
| 2004/0253811 A1* | 12/2004 | Lee | H01L 21/76828 |
| | | | 438/633 |
| 2006/0131630 A1* | 6/2006 | Sun | H01L 27/10855 |
| | | | 257/296 |
| 2007/0197021 A1* | 8/2007 | Nam | H01L 21/76897 |
| | | | 438/622 |
| 2010/0025855 A1* | 2/2010 | Streck | H01L 21/76816 |
| | | | 257/773 |
| 2011/0183512 A1* | 7/2011 | Cho | H01L 23/5226 |
| | | | 438/627 |
| 2015/0091181 A1 | 4/2015 | Li et al. | |
| 2017/0062275 A1 | 3/2017 | Lenhardt et al. | |
| 2018/0315654 A1 | 11/2018 | Briggs et al. | |
| 2019/0019726 A1 | 1/2019 | Ryan et al. | |
| 2019/0080960 A1* | 3/2019 | Ho | H01L 21/76831 |
| 2019/0148220 A1 | 5/2019 | Wallace et al. | |
| 2019/0252208 A1 | 8/2019 | Wallace et al. | |

OTHER PUBLICATIONS

Kanarik et al., "Atomic Layer Etching: Rethinking the Art of Etch", The Journal of Chemistry Letters. vol. 9, No. 16. Aug. 10, 2018. pp. 4814-4821.

Zhou et al., "A Study of Self-Aligned-via based All-in-one Etch", ECS Transactions. vol. 60, No. 1. Feb. 27, 2014. pp. 331-336.

* cited by examiner

VIA FORMATION WITH ROBUST HARDMASK REMOVAL

BACKGROUND

The present invention generally relates to semiconductor devices, and more particularly to the formation of self-aligned vias.

Semiconductor devices can include vias to electrically connect conductive lines or other conductive structures to other conductive lines or conductive structures. Vias can be formed by etching openings within dielectric material and filling the openings with conductive material. However, overetching can occur when an opening lands at an edge of an underlying contact due to misalignment. Such overetching can expose underlying material to damage during device processing and can lead to decreased connectivity.

SUMMARY

In accordance with an embodiment of the present invention, a method for fabricating a semiconductor device is provided. The method includes etching, using a patterning stack including a hardmask layer, at least one opening and hardmask layer portions. The at least one opening defines a cavity disposed within a first interlayer dielectric (ILD) layer of a base structure adjacent to a contact of the base structure resulting from overetching due to misalignment. The method further includes redefining the cavity into a plug cavity using an etch process that partially removes the hardmask layer portions, and forming a conductive plug within the plug cavity to protect underlying material.

In accordance with another embodiment of the present invention, a method for fabricating a semiconductor device is provided. The method includes etching, using a patterning stack including a hardmask layer, a first opening and a second opening and hardmask layer portions. The first opening defines a cavity disposed within a first interlayer dielectric (ILD) layer of a base structure adjacent to a contact of the base structure resulting from overetching due to misalignment. The method further includes redefining the cavity into a plug cavity using an etch process that partially removes the hardmask layer portions, conformally depositing a second conductive liner along exposed surfaces and within the plug cavity, removing portions of the second conductive liner to form a conductive plug in the plug cavity to protect underlying material, and forming a metallization level after the conductive plug is formed by removing the hardmask layer portions, and filling the first and second openings with conductive material.

In accordance with yet another embodiment of the present invention, a semiconductor device is provided. The device includes a base structure including a first interlayer dielectric (ILD) layer and a contact including a conductive liner disposed along a conductive core, a conductive plug disposed on the conductive liner between the conductive core and the first ILD layer to a height of the base structure, and a metallization level including a conductive line and a self-aligned via underneath the conductive line disposed on the contact and the conductive plug. The conductive plug protects underlying material and increases connectivity between the self-aligned via and the contact that was reduced due to misalignment.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
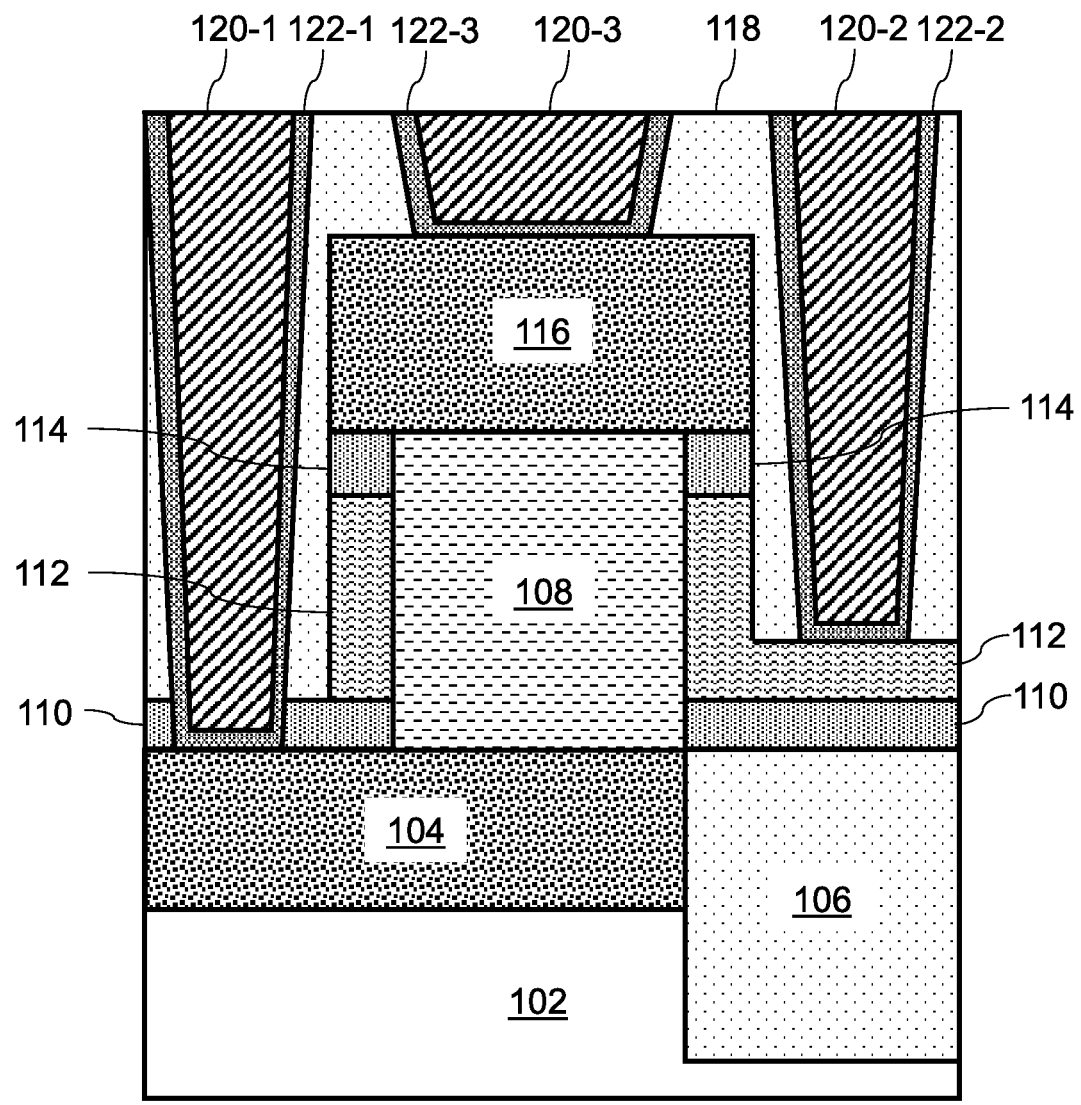
FIG. 1 is a cross-sectional view of a semiconductor device including a vertical transistor device, in accordance with an embodiment of the present invention.

The embodiments described herein provide for the formation of a semiconductor device including a metallization level having a via (e.g., a self-aligned via) disposed on a contact, and a plug (e.g., conductive plug) underneath the via adjacent to the contact separating the via material from the contact. The contact can include a conductive core and a conductive liner. The plug can be formed as a way to mitigate effects of overetching resulting from misalignment during via processing. More specifically, the plug can protect underlying material and improve connectivity when the via is formed at the edge of the underlying contact. In one embodiment, the conductive core can be a top source/drain contact corresponding to a top source/drain region of the vertical transistor device, with the top source/drain region being located underneath the conductive core.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a semiconductor device 100 is shown.

The device 100 includes a substrate 102. The substrate 102 can include any suitable substrate structure, e.g., a bulk semiconductor, a semiconductor-on-insulator (SOI) substrate, etc. In one example, the substrate 102 can include a silicon-containing material. Illustrative examples of Si-containing materials suitable for the substrate 102 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide.

As further shown, a bottom source/drain region 104 is formed on the substrate 102, and ashallow trench isolation (STI) region 106 are formed on the substrate to a height of the bottom source/drain region 104. The bottom source/drain region 104 and the STI region 106 can include any suitable materials in accordance with the embodiments described herein. For example, the bottom source/drain region 104 can include epitaxially material that is epitaxially grown or deposited on the substrate 102. The STI region 106 can include, e.g., silicon dioxide ($SiO_2$) or other suitable dielectric material.

The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

As further shown, a semiconductor fin ("fin") 108 is formed on the bottom source/drain region 104. The fin 108 can be one of a plurality of fins of the device 100. The fin 108 can include any suitable material in accordance with the embodiments described herein. For example, the plurality of fins can include, e.g., Si, Ge, SiGe, or other suitable semiconductor material.

As further shown, a bottom spacer 110 is formed on the bottom source/drain region 104 and STI regions 106 adjacent to the fin 108. The bottom spacer 110 can include any suitable dielectric material in accordance with the embodiments described herein. Examples of materials that can be used to form the bottom spacer 110 include, but are not limited to, $SiO_2$, silicon nitride (SiN), etc.

As further shown, gate structures 112 are formed on the bottom spacer 110 and along the sidewalls of the fin 108. The gate structures 112 can include any suitable materials in accordance with the embodiments described herein. More specifically, the gate structures 112 can include a gate dielectric and a gate conductor.

In one embodiment, the gate structures 112 can include high-k metal gate (HKMG) materials. HKMG material includes a high-k dielectric material as the gate dielectric and a metal gate as the gate conductor (as opposed to a polysilicon gate). A high-k dielectric material is one that has a dielectric constant k greater than the dielectric constant of $SiO_2$ at room temperature (e.g., about 20° C.-25° C.) and atmospheric pressure (e.g., about 1 atm). For example, a high-k dielectric material can have a dielectric constant of greater than about 3.9. Examples of high-k dielectric materials that can be used include, but are not limited to, hafnium silicate ($HfO_4Si$), zirconium silicate ($ZrSiO_4$), hafnium dioxide ($HfO_2$) and zirconium dioxide ($ZrO_2$).

As further shown, pairs of top spacers 114 are each formed on a gate structure 112 adjacent to the fin 108. The top spacers 114 can include any suitable dielectric material in accordance with the embodiments described herein. Examples of materials that can be used to form the top spacers 114 include, but are not limited to, $SiO_2$, silicon nitride (SiN), etc.

As further shown, a top source/drain region 116 is formed on the fin 108 and the pair of top spacers 114. The top source/drain region 116 can include any suitable material in accordance with the embodiments described herein. For example, the top source/drain region material 116 can include an epitaxially grown material.

As further shown, an interlevel dielectric (ILD) layer 118 is formed, a plurality of conductive cores 120-1 through 120-3 are formed through the ILD layer onto respective ones of the bottom source/drain region 104, the gate 112 and the top source/drain region 116, and each of the plurality of conductive cores 120-1 through 120-3 is surrounded by a respective one of a plurality of conductive liners 122-1 through 122-3.

The conductive cores 120-1 through 120-3 and their respective conductive liners 122-1 through 122-3 collectively form a contact. More specifically, the conductive core 120-1 and the conductive liner 122-1 collectively form a bottom source/drain contact, the conductive core 120-2 and the conductive liner 122-2 collective form a gate contact, and the conductive core 120-3 and the conductive liner 122-3 collectively form a top source/drain contact.

The ILD layer 118 can include any suitable dielectric material in accordance with the embodiments described herein. For example, the ILD layer 118 can include, e.g., $SiO_2$ or other suitable dielectric material.

The plurality of conductive cores 120-1 through 120-3 can include any suitable material(s) in accordance with the embodiments described herein. Examples of materials that can be used to form the plurality of conductive cores 120-1 through 120-3 include, but are not limited to, tungsten (W), ruthenium (Ru), cobalt (Co), copper (Cu), etc. In one embodiment, each of the plurality of conductive cores 120-1 through 120-3 can include the same conductive material. In other embodiments, one or more of the plurality of conductive cores 120-1 through 120-3 can include a different conductive material.

The plurality of conductive liners 122-1 through 122-3 can include any suitable material(s) in accordance with the embodiments described herein. Examples of materials that can be used to form the conductive liner 104 include, but are not limited to, titanium nitride (TiN), tantalum nitride (TaN), etc. In one embodiment, each of the plurality of conductive liners 122-1 through 122-3 can include the same conductive material. In other embodiments, one or more of the plurality of conductive liners 122-1 through 122-3 can include a different conductive material.

If at least one via is subsequently formed over at least one of the contacts (e.g., the contact corresponding to the conductive core 120-3 and the conductive liner 122-3), various processes used to form the at least one via may damage the conductive liner and/or other underlying material (e.g., the underlying top source/drain region 116) as a result of overetching due to misalignment. Also, if the via is formed at edge of the contact due to the misalignment, poor contact connection may result. As will be described in further detail below with reference to FIGS. 2-10, the embodiments described herein can provide a way to address such overetching and/or misalignment by underlaying material damage and/or improving connectivity when the via lands at edge of the contact.

Figure 2:
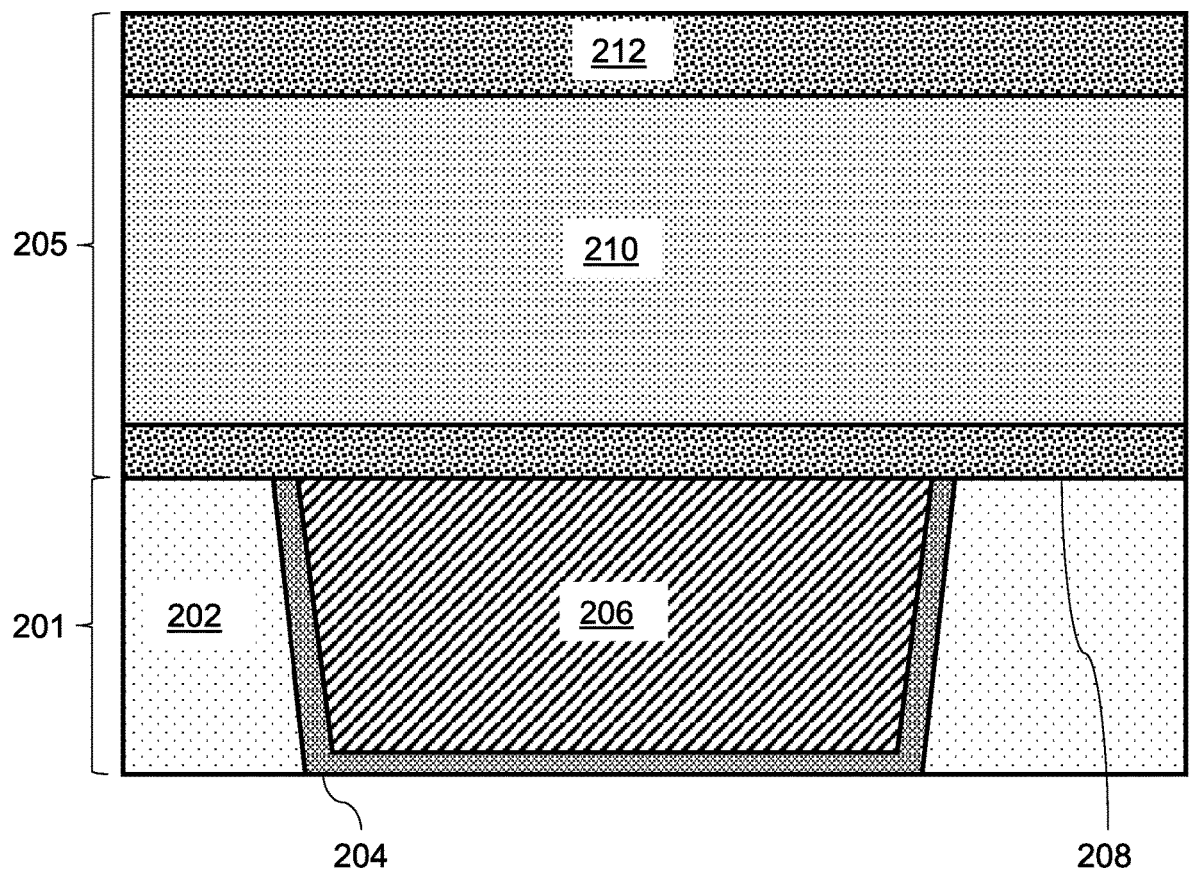
FIG. 2 is a cross-sectional view of the formation of a dielectric material stack on a base structure during the fabrication of a semiconductor device, in accordance with an embodiment of the present invention.

With reference to FIG. 2, a semiconductor device 200 is shown.

As shown, the device 200 includes a base structure 201 including an interlevel dielectric (ILD) layer 202, a conductive liner 204 and a conductive core 206. Forming the base structure 201 can include forming a trench within dielectric material to form the ILD 102, conformally depositing the conductive liner 104 along the trench, and forming the conductive core 106 on the conductive liner 104.

The ILD layer 202 can include any suitable material in accordance with the embodiments described herein. For example, the ILD layer 102 can include, e.g., $SiO_2$ or other suitable dielectric material.

The conductive liner 204 can include any suitable material in accordance with the embodiments described herein. Examples of materials that can be used to form the conductive liner 104 include, but are not limited to, titanium nitride (TiN), tantalum nitride (TaN), etc.

The conductive core 206 can include any suitable material(s) in accordance with the embodiments described herein. Examples of materials that can be used to form the conductive core 206 include, but are not limited to, tungsten (W), ruthenium (Ru), cobalt (Co), copper (Cu), etc.

Although not shown, the base structure 201 can be formed on underlying structures. In one embodiment, the base structure 201 can be formed across a transistor device, such that the conductive liner 204 and the conductive core 206 collectively correspond to a contact disposed on a component of the transistor device. For example, the device 200 can include a vertical transistor device similar to the vertical transistor device shown in FIG. 1, such that the conductive core 206 corresponds to the conductive core 120-3 of FIG. 1, the conductive liner 204 corresponds to the conductive liner 122-3 of FIG. 1, the ILD layer 202 corresponds to the ILD layer 118 of FIG. 1, and the conductive core 206 and the conductive liner 204 collectively form a contact for the top source/drain region 116 of FIG. 1. However, such an embodiment should not be considered limiting. For example, the underlying structures can correspond to other types of devices including, but not limited to, fin field-effect transistor (FinFET devices), nanosheet devices, planar complementary metal-oxide semiconductor (CMOS) devices, bipolar transistor devices, memory devices, passive devices, etc. Accordingly, the ILD layer 202 can isolate at least the conductive core 206 and the conductive liner 204 from other contacts of a transistor device (e.g., gate and bottom source/drain contacts of a vertical transistor device).

As further shown, a dielectric stack 205 is formed across the base structure 201. The dielectric stack 205 can include a cap layer 208, an ILD layer 210, and a sacrificial cap layer 212.

The cap layer 208 and the sacrificial cap layer 212 can include any suitable material(s) in accordance with the embodiments described herein. For example, the cap layer 208 and the sacrificial cap layer 212 can include, e.g., a nitride material (e.g., a silicon nitride material).

The ILD layer 210 can include any suitable material in accordance with the embodiments described herein. For example, the ILD layer 210 can include, e.g., a low-k dielectric material.

A low-k dielectric material is a material with a dielectric constant k less than the dielectric constant of $SiO_2$ at room temperature (e.g., about 20° C.-25° C.) and atmospheric pressure (e.g., about 1 atm). For example, a low-k dielectric material can have a dielectric constant of less than about 3.9. The ILD layer 210 can have a dielectric constant k between, e.g., about 2.3 and 2.7. In one embodiment, the ILD layer 210 can include an ultra low-k dielectric (ULK) material having a dielectric constant less than or equal to, e.g., about 2.5. Examples of suitable materials that can be used to form the ILD layer 210 include, but are not limited to, octamethylcyclotetrasiloxane (OMCTS), flowable low-k dielectrics (FCVD), spin-on glass dielectrics (SOG), porous silicon carbonitride (SiCN), etc.

Figure 3:
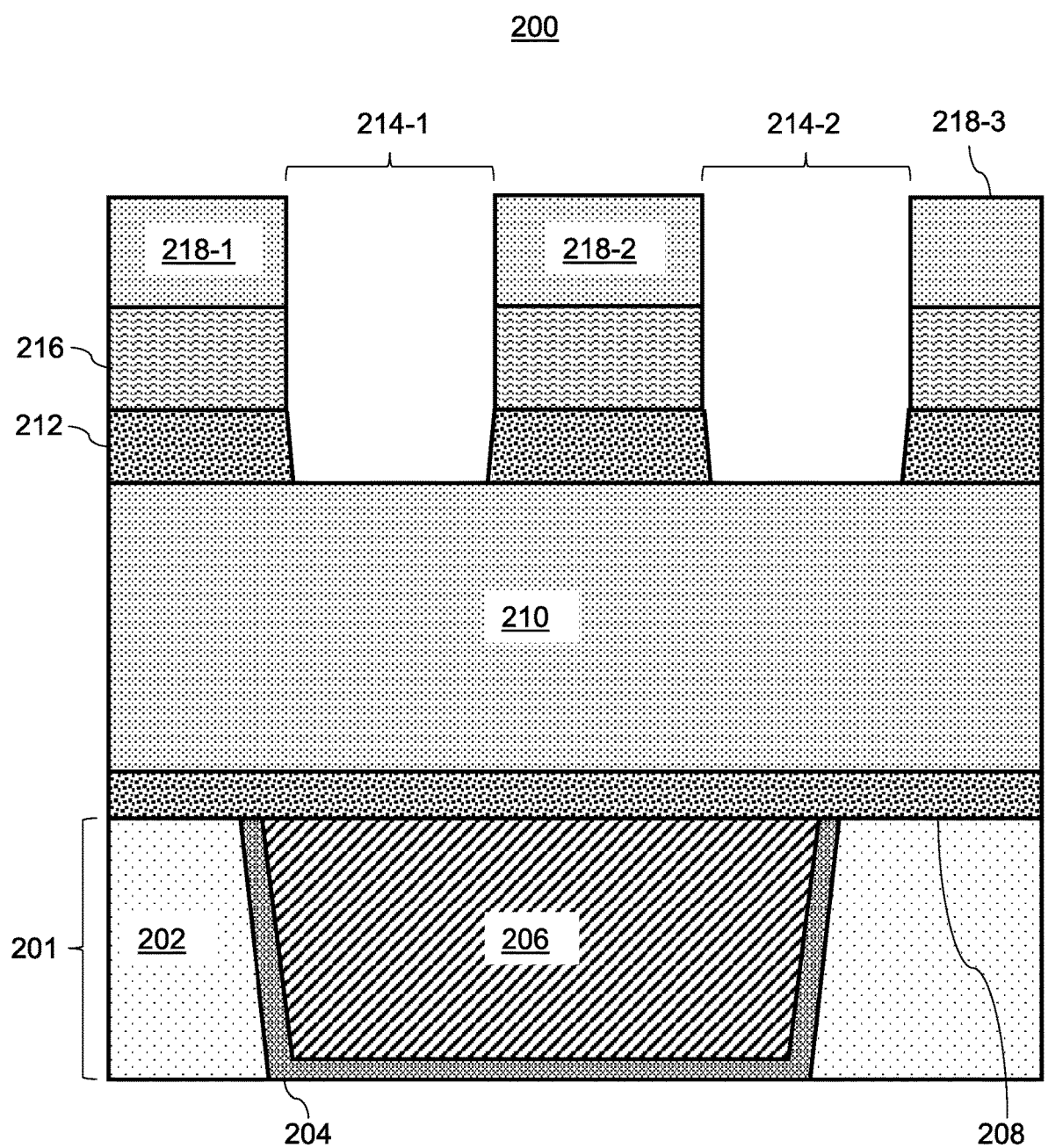
FIG. 3 is a cross-sectional view of the formation of a patterning stack and patterning performed using the patterning stack during the fabrication of the semiconductor device, in accordance with an embodiment of the present invention.

With reference to FIG. 3, patterning is performed to form openings 214-1 and 214-2 by etching through a patterning stack and the sacrificial cap layer 212. In this illustrative example, the patterning stack includes a hardmask layer and a dielectric layer, such that the patterning results in the formation of hardmask layer portions 216 and dielectric layer portions 218-1 through 218-3. Any suitable etch process can be used to form the openings 214-1 and 214-2 in accordance with the embodiments described herein. The etching can cause the openings 214-1 and 214-2 to have a tapered geometry or profile in the region between portions of the sacrificial cap layer 212.

The patterning stack can include any suitable materials in accordance with the embodiments described herein. In one embodiment, the hardmask layer portions 216 include titanium nitride (TiN). The dielectric layer portions 218-1 through 218-3 can include, e.g., silicon dioxide ($SiO_2$) (e.g., tetraethyl orthosilicate (TEOS) based $SiO_2$) or other suitable dielectric material.

Figure 4:
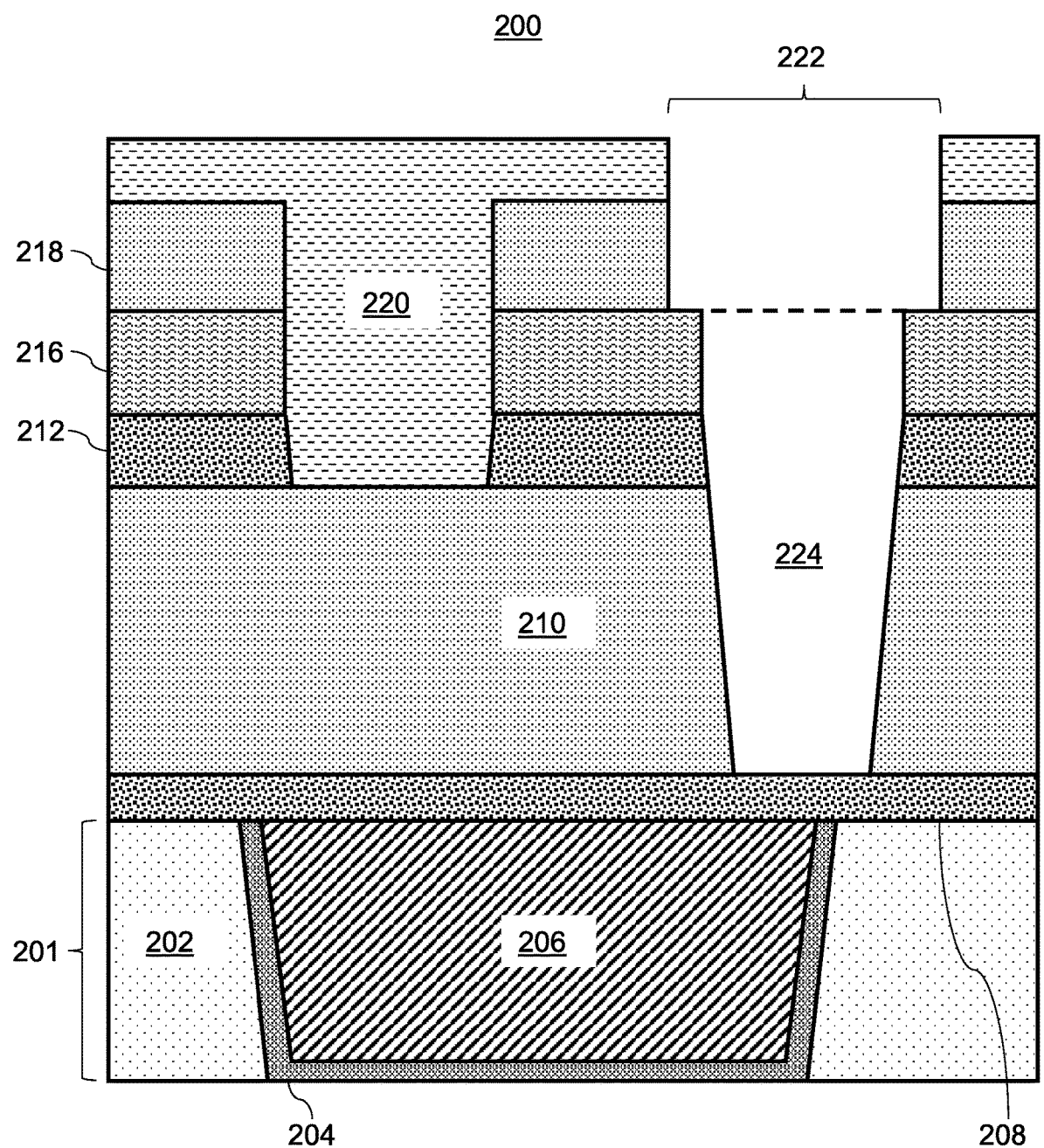
FIG. 4 is a cross-sectional view of patterning performed during the fabrication of the semiconductor device, in accordance with an embodiment of the present invention.

With reference to FIG. 4, patterning is performed to form gap 222 and region 224. More specifically, a planarization layer 220 can be formed within the openings 214-1 and 214-2, and the planarization layer 220, the dielectric layer portions 218-2 and 218-3 and the ILD 210 can be etched while the hardmask 214 protects the sacrificial cap layer 212. Any suitable etch process can be used to form the gap 222 and the region 224 in accordance with the embodiments described herein.

The planarization layer 220 can include any suitable material in accordance with the embodiments described herein. In one embodiment, the planarization layer 220 includes an organic planarization layer (OPL). Examples of materials that can be used to form an OPL include, but are not limited to, acryl-based resins, polyimide-based resins, benzocyclobutene (BCB), etc.

As will be described below with reference to FIG. 5, an opening will be formed based on the region 224 corresponding to a via that will be formed on the contact 204/206. However, as shown, the processing performed in FIGS. 3 and 4 has resulted in the region 224 being misaligned with respect to the contact 204/206, such that the subsequently formed via will be formed over the edge of the conductive liner 204.

Figure 5:
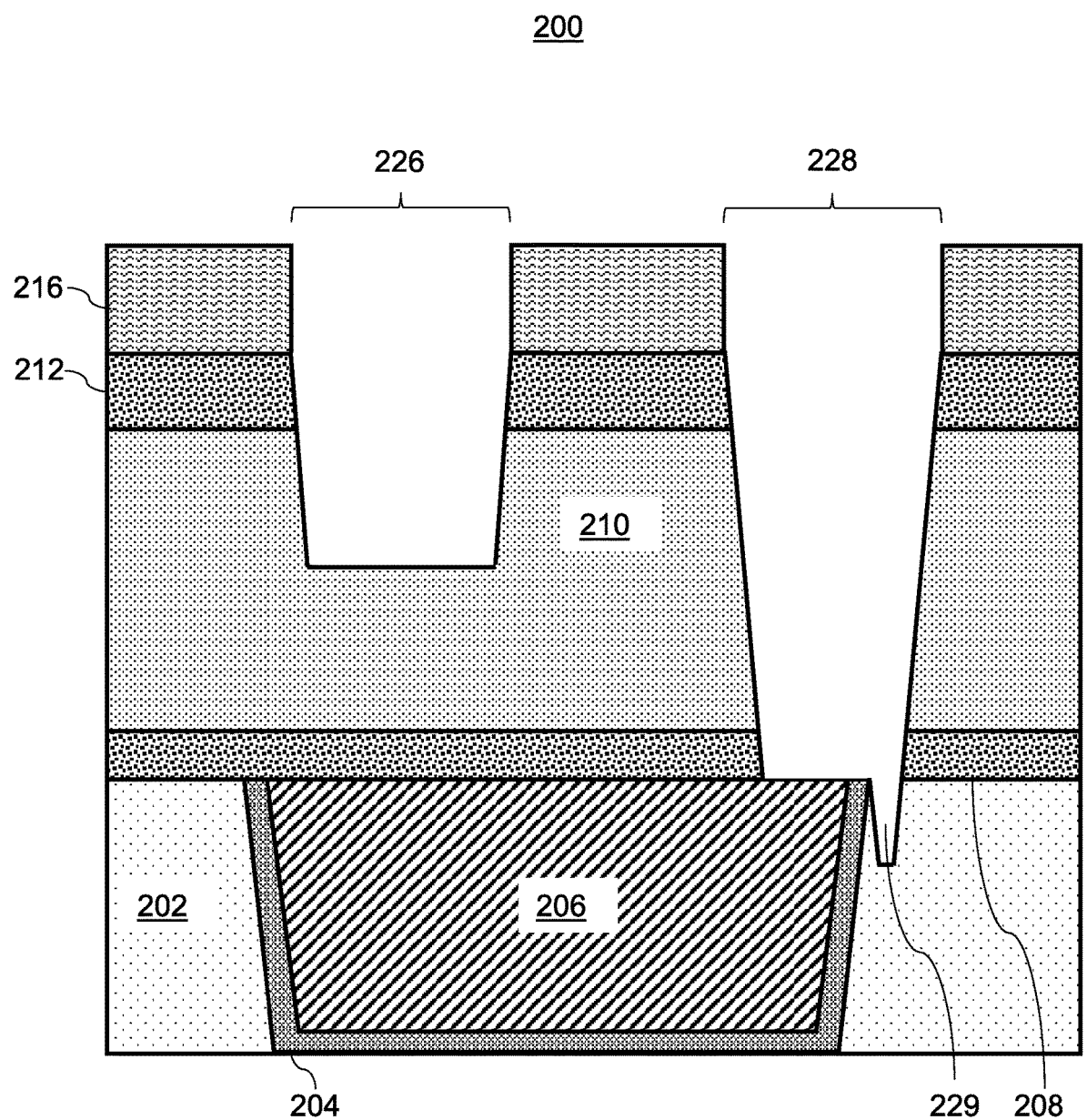
FIG. 5 is a cross-sectional view of additional etching performed during the fabrication of the semiconductor device, in accordance with an embodiment of the present invention.

With reference to FIG. 5, the planarization layer 220 is removed (e.g., stripped), and a patterning process is performed to form openings 226 and 228. The processing results in the removal of the dielectric layer portions 218-1 through 218-3 as well. As will be described in further detail below, the conductive line will be formed on the self-aligned via within the opening 228.

More specifically, the opening 226 is formed by etching within the ILD layer 210 through the previous opening 214-1 that was exposed after removing the planarization layer 220, and the opening 228 is formed by etching through the cap layer 208 exposing surfaces of the conductive liner 104 and the conductive core 106. Any suitable etch process can be used to form the openings 226 and 228 in accordance with the embodiments described herein. In one embodiment, reactive-ion etching (RIE) can be used to form the openings 226 and 228.

As a result of overetching due to misalignment, the opening 228 further includes a cavity 229 formed within the ILD layer 210. As will be described in further detail below, the overetching will be pinched off by conductive liner material to protect any underlying structures during removal of the hardmask layer portions 216.

Figure 6:
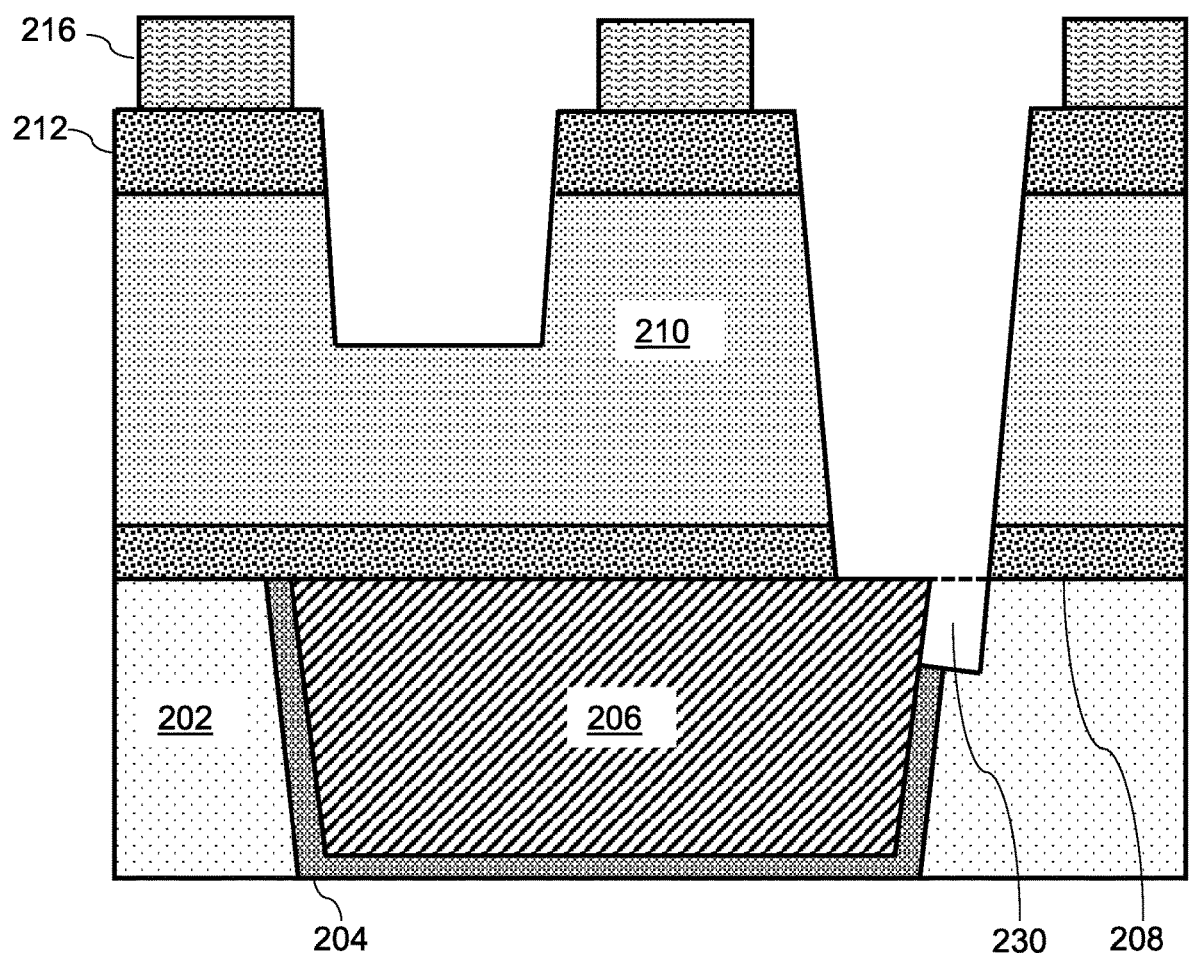
FIG. 6 is a cross-sectional view of partial removal of a hard mask layer of the patterning stack during the fabrication of the semiconductor device, in accordance with an embodiment of the present invention.

With reference to FIG. 6, the openings 226 and 228 are redefined using an etch process that partially removes the hardmask layer portions 216. Instead of fully removing the hardmask layer portions 216, which can damage the conductive liner 104 and cause excessive undercut, a partial etch is performed with less budget. Accordingly, the partial removal of the hardmask layer portions 216 can limit damage to underneath structures without excessive undercut.

As further shown, the etching performed to partially remove the hardmask layer portion 216 redefines the cavity 229 to form a plug cavity 230. As will be described in further detail below, the plug cavity 230 will be filled with conductive liner material to form a conductive plug ("plug") that can be used to protect underlying structures, such as the conductive liner 104 and any material underneath (e.g., source/drain material) during subsequent removal of the hardmask layer portions 216.

The amount of material from the hardmask portions 216 removed during the partial removal is not important, and only some of the wet etch budget needs to be applied to remove the conductive liner 204 from the sidewall of the conductive core 206. The amount of the conductive liner 204 that is removed can be equal to about the thickness of conductive liner 204 at the sidewall of the conductive core 206. For example, if the thickness of the conductive liner 204 is, e.g., about 3 nm and the thickness of hardmask layer portions 216 is more than, e.g., about 4.5 nm, an isotropic removal of, e.g., about 4.5 nm can be applied, which is about a 50% overetch that will ensure that the sidewall of conductive liner 204 is removed from the sidewall of the conductive core 206 while partially removing the hardmask layer portions 216. The amount of material removed from the hardmask layer portions 216 need not be controlled, as any remaining portions will be removed later.

Figure 7:
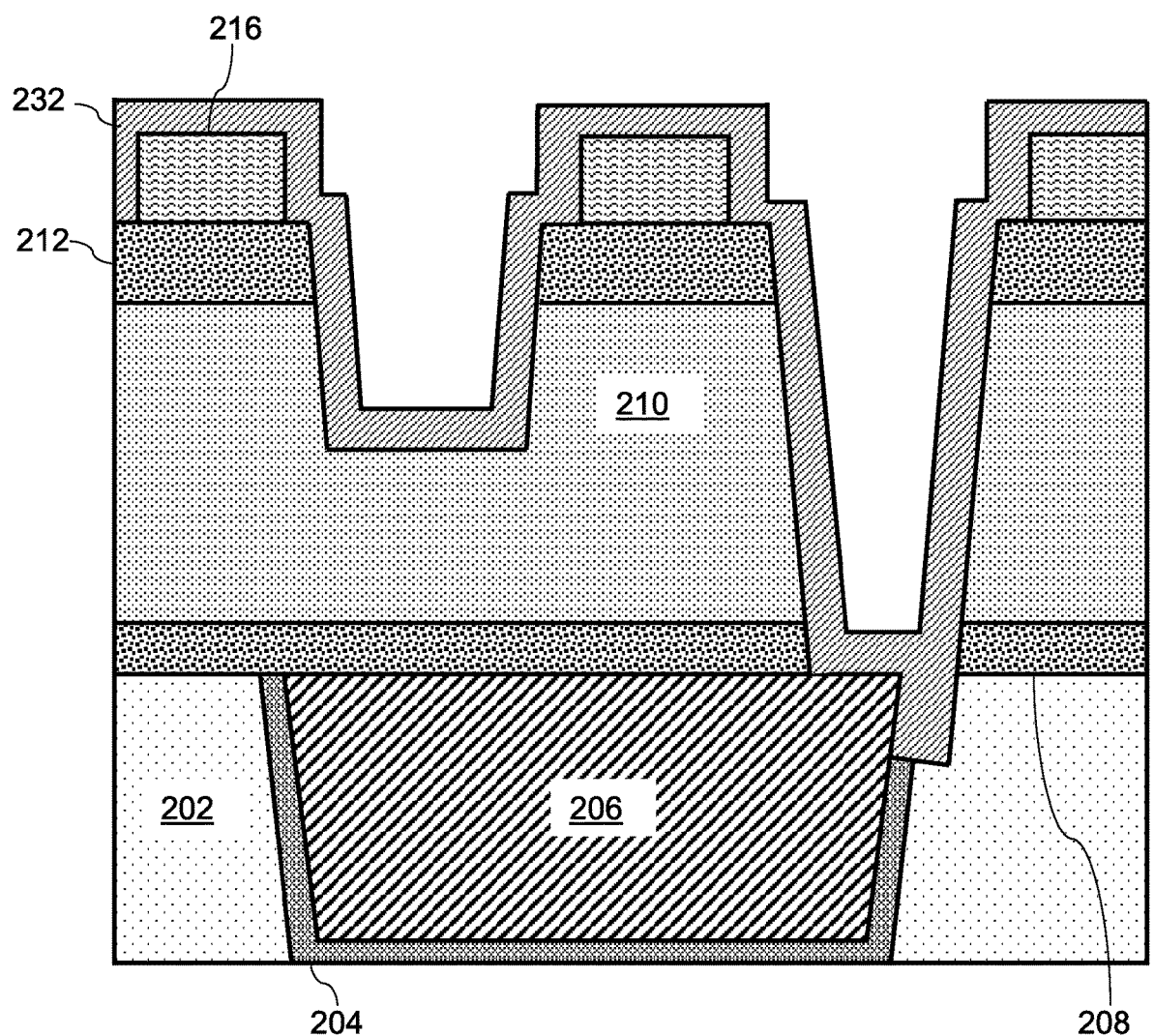
FIG. 7 is a cross-sectional view of the formation of a conductive liner during the fabrication of the semiconductor device, in accordance with an embodiment of the present invention.

With reference to FIG. 7, a conductive liner 232 is formed along exposed surfaces of the device 200. More specifically, the conductive liner 232 is conformally deposited along exposed surfaces of the device 200 and within the plug cavity 230. Any suitable process can be used to form the conductive liner 232 in accordance with the embodiments described herein. Examples of suitable processes that can be used to form the conductive liner 232 include, but are not limited to, atomic layer deposition (ALD), physical vapor deposition (PVD), chemical vapor deposition (CVD), etc.

The conductive liner 232 can include any suitable material in accordance with the embodiments described herein. Examples of materials that can be used to form the conductive liner 132 include, but are not limited to, ruthenium (Ru), cobalt (Co), tungsten (W), etc.

Figure 8:
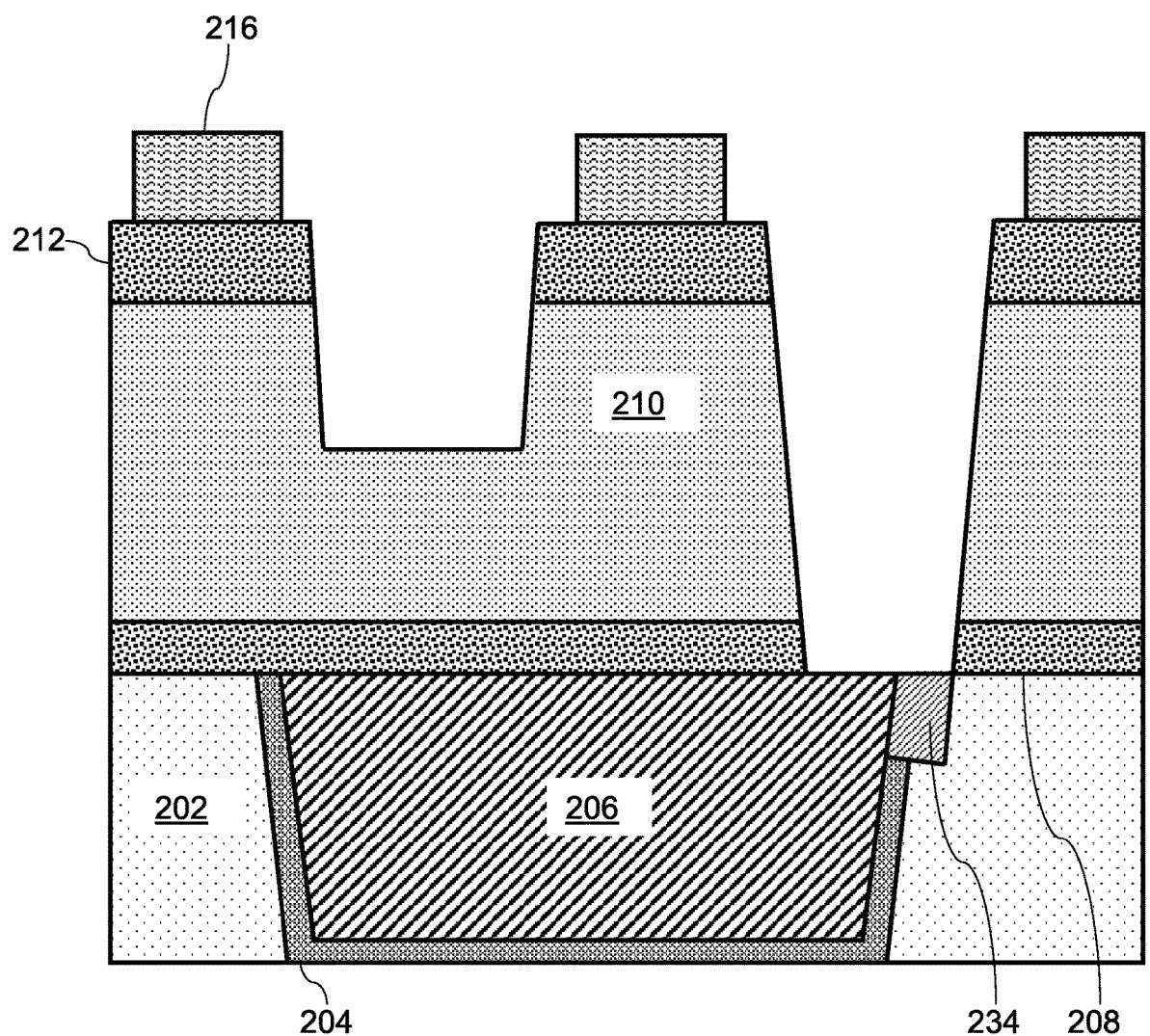
FIG. 8 is a cross-sectional view of the etching of the conductive liner to form a via plug during the fabrication of the semiconductor device, in accordance with an embodiment of the present invention.

With reference to FIG. 8, portions of the conductive liner 232 are removed to form a conductive plug ("plug") 234 within the plug cavity 230. Any suitable process can be used to remove the portions of the conductive liner 232 to form the plug 234 in accordance with the embodiments described herein. In one embodiment, isotropic etching is used to remove the portions of the conductive liner 232 to form the plug 234.

In the nominal case, as shown in FIG. 8, no residual portion of the conductive liner 232 exists outside of the plug 234. However, in some embodiments, residual portion(s) of the conductive liner 232 can remain on a surface of the device 200 due to semiconductor device manufacturing variation. For example, some of the conductive liner material can remain, e.g., on the bottom of the trench in the ILD layer 210. However, in accordance with the embodiments described herein, the occurrence of device failure can be reduced or eliminated even with the existence of such residual portions.

Figure 9:
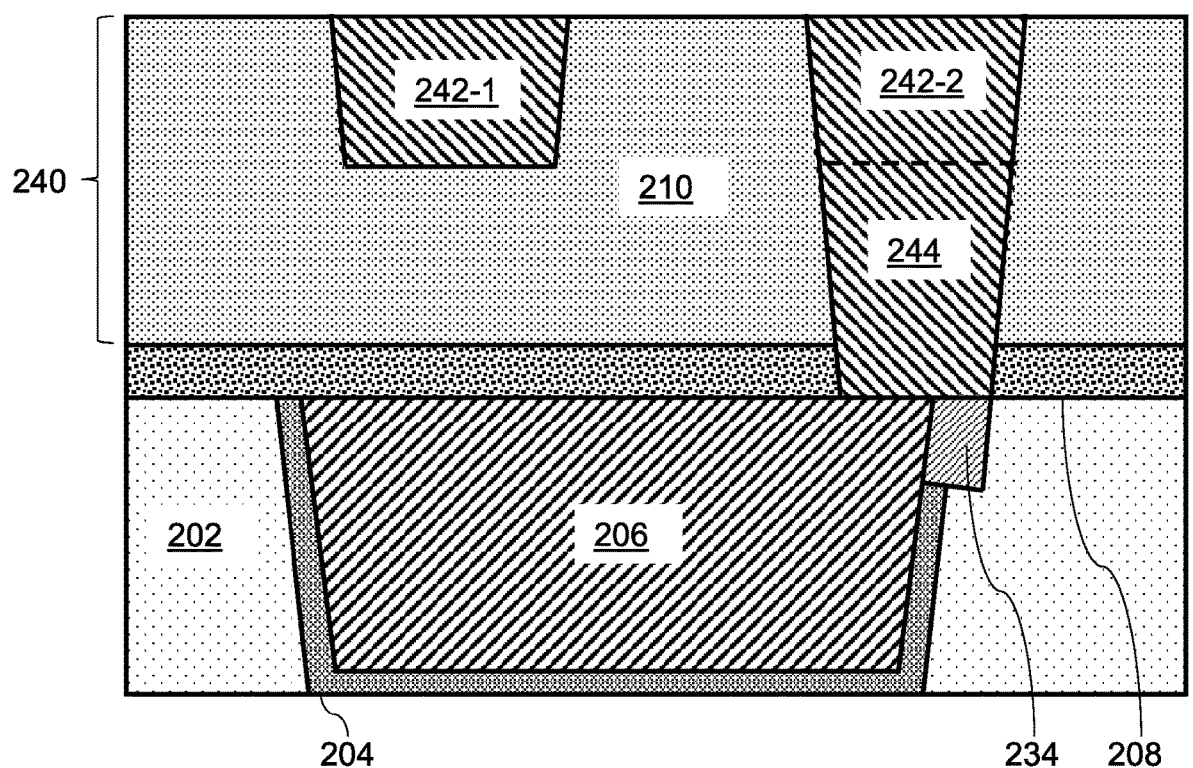
FIG. 9 is a cross-sectional view of the formation a metallization level during the fabrication of the semiconductor device, in accordance with an embodiment of the present invention.

With reference to FIG. 9, a metallization level 240 is formed by removing the hardmask layer portions 216 and the remaining portions of the sacrificial cap layer, and filling the redefined openings with conductive material. More specifically, a conductive line 242-1 is formed within one of the redefined openings, and a conductive line 242-2 and a via 244 are formed within another one of the redefined openings. More specifically, the via 244 can be a self-aligned via. The via 244 is in contact with the conductive core 206 and the plug 234. Any suitable process can be used to remove the hardmask layer portions 216 in accordance with the embodiments described herein.

Although the via 244 is itself a misaligned via, the plug 234 mitigates the effects of the misalignment by providing a conductive landing area for the via 244. Accordingly, the plug 234 is an extension of the via 244 formed within the redefined opening.

Any suitable conductive material can be used to form the conductive lines 242-1 and 242-2 and the via 244 in accordance with the embodiments described herein. Examples of materials that can be used to form the conductive lines 242-1 and 142-2 and the via 244 include, but are not limited to, copper (Cu), cobalt (Co), tungsten (W), tantalum (Ta), ruthenium (Ru), titanium (Ti), etc.

Figure 10:
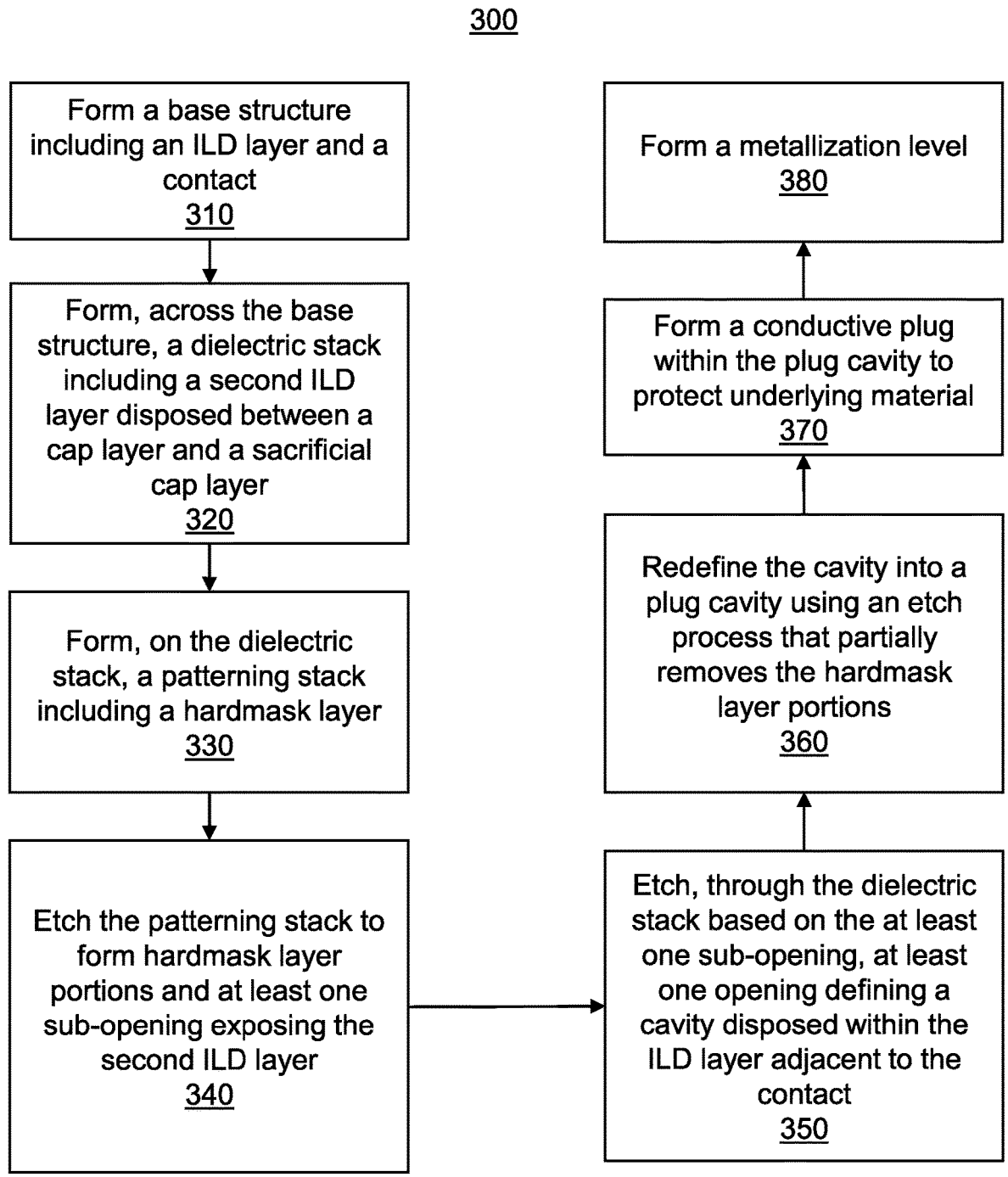
FIG. 10 is a block/flow diagram illustrating a system/method for fabricating a semiconductor device, in accordance with an embodiment of the present invention.

With reference to FIG. 10, a block/flow diagram is provided illustrating a system/method 300 for fabricating a semiconductor device.

At block 310, a base structure including an interlevel dielectric (ILD) layer and a contact is formed. For example, the contact can include a conductive core and a conductive liner on the conductive core. More specifically, the conductive liner can be formed around sidewalls and a bottom surface of the conductive core. Forming the base structure can include forming dielectric material on the underlying structure, etching through the dielectric material to form the ILD layer and expose the underlying structure, conformally depositing the conductive liner along the ILD layer and the underlying structure, and forming conductive material on the conductive liner to form the conductive. Any suitable processes can be used to form the base structure in accordance with the embodiments described herein. The base structure can include any suitable materials in accordance with the embodiments described herein.

The contact can be formed on an underlying structure of a semiconductor device. In one embodiment, the conductive core can be a top source/drain contact of a vertical transistor device corresponding to a top source/drain region. The vertical transistor device can further include, e.g., a bottom source/drain region, a fin between the bottom source/drain region and the top source/drain region, a gate structure, a bottom source/drain contact formed on the bottom source/drain region and a gate contact formed on the gate structure. However, the semiconductor device can include any suitable device in accordance with the embodiments described herein.

At block 320, a dielectric stack including a second ILD layer disposed between a cap layer and a sacrificial cap layer is formed across the base structure. More specifically, forming the dielectric stack can include forming the cap layer over the base structure, forming the second ILD layer over the cap layer, and forming the sacrificial cap layer over the second ILD layer. Any suitable processes can be used to form the dielectric stack in accordance with the embodiments described herein. The cap layer, the second ILD layer, and the sacrificial cap layer can include any suitable materials in accordance with the embodiments described herein.

Further details regarding blocks 310 and 320 are described above with reference to FIGS. 1 and 2.

At block 330, a patterning stack including a hardmask layer is formed on the dielectric stack. In one embodiment, the patterning stack can include a hardmask layer and a dielectric layer. More specifically, the hardmask layer can be formed on the dielectric stack, and the dielectric layer can be formed on the hardmask layer. Any suitable process can be used to form the patterning stack in accordance with the embodiments described herein. The patterning stack can include any suitable materials in accordance with the embodiments described herein. In one embodiment, the hardmask layer can include titanium nitride (TiN). However, such an embodiment should not be considered limiting. The dielectric layer can include, e.g., silicon dioxide ($SiO_2$) or other suitable dielectric material.

At block 340, the patterning stack is etched to form hardmask layer portions and at least one sub-opening exposing the second ILD layer. The etching as block 340 removes portions of the sacrificial cap layer, and can further form dielectric layer portions. The at least one sub-opening can be misaligned with respect to the contact, such that a via that will be formed based on the at least one sub-opening will land on an edge of the contact. Any suitable processes can be used to etch the patterning stack and the sacrificial cap layer in accordance with the embodiments described herein. Etching through the patterning stack can further form a second sub-opening exposing the second ILD layer.

Further details regarding blocks 330 and 340 are described above with reference to FIG. 3.

At block 350, at least one opening defining a cavity disposed within the ILD layer adjacent to the contact is etched through the dielectric stack based on the at least one sub-opening. The at least one opening exposes a portion of the conductive core and the conductive liner. Forming the at least one opening can further include forming a second opening to a height within the second ILD layer based on the second sub-opening. The cavity is formed as result of overetching due to misalignment.

More specifically, forming the at least one opening can include forming a planarization layer (e.g., organic planarization layer (OPL)), etching through the at least one sub-opening using the planarization layer to expose the sacrificial cap layer, removing the planarization layer, and etching through the sacrificial cap layer to form the opening (e.g., using reactive-ion etching (RIE)). The planarization layer can remain in the second sub-opening during the etching through the sub-opening. The cavity is formed as result of overetching that occurred while etching through the sacrificial cap layer to form the at least one opening due to the misalignment of the at least one sub-opening. Any suitable processes can be used to form the at least one opening in accordance with the embodiments described herein.

Further details regarding block 350 are described above with reference to FIGS. 4 and 5.

At block 360, the cavity is redefined into a plug cavity using an etch process that partially remove the hardmask layer portions. The etch process redefines the at least one opening, which can include the second opening. Instead of fully removing the hardmask layer portions, which can cause damage and excessive undercut, a partial etch can be performed with less budget. Accordingly, the partial removal of the hardmask layer portions can limit damage to underneath structures without excessive undercut. Any suitable processes can be used to remove the hardmask layer portions in accordance with the embodiments described herein.

The amount of material from the hardmask portions removed during the partial removal is not important, and only some of the wet etch budget needs to be applied to remove the conductive liner from the sidewall of the conductive core. The amount of the conductive liner that is removed can be equal to about the thickness of conductive liner at the sidewall of the conductive core. For example, if the thickness of the conductive liner is, e.g., about 3 nm and the thickness of hardmask layer portions is more than, e.g., about 4.5 nm, an isotropic removal of, e.g., about 4.5 nm can be applied, which is about a 50% overetch that will ensure that the sidewall of conductive liner is removed from the sidewall of the conductive core while partially removing the hardmask layer portions 216. The amount of material removed from the hardmask layer portions 216 need not be controlled, as any remaining portions will be removed later.

Further details regarding block 360 are described above with reference to FIG. 6.

At block 370, a conductive plug is formed within the plug cavity to protect underlying material. Forming the conductive plug can include conformally depositing a second conductive liner along exposed surfaces and within the plug cavity, and removing portions of the second conductive liner to form the conductive plug. In one embodiment, isotropic etching is used to remove the portions of the second conductive liner. The conductive plug can also increase connectivity between the contact and a via that will be formed on the contact, which could have been decreased as a result of the misalignment.

Any suitable processes can be used to fill the plug cavity to form the plug in accordance with embodiments described herein. Any suitable material can be used to form the second conductive liner in accordance with the embodiments described herein.

In the nominal case, no residual portion of the second conductive liner exists outside of the conductive plug. However, in some embodiments, residual portion(s) of the second conductive liner can remain on a surface of the device due to semiconductor device manufacturing variation. For example, some of the second conductive liner can remain, e.g., on the bottom of the trench in the second ILD layer. However, in accordance with the embodiments described herein, the occurrence of device failure can be reduced or eliminated even with the existence of such residual portions.

Further details regarding block 370 are described above with reference to FIGS. 7 and 8.

At block 380, a metallization level is formed. More specifically, the metallization level can be formed by removing the hardmask layer portions and the sacrificial cap layer, and filling the redefined opening with conductive material. In one embodiment, the conductive material within the redefined opening includes a conductive line and a via (e.g., self-aligned via) disposed on the conductive core and the conductive plug underneath the conductive line. Forming the metallization level can further include filling the second redefined opening with the conductive material. The conductive material within the second redefined opening can include at least a second conductive line.

Any suitable processes can be used to remove the hardmask layer portions and form the metallization level in accordance with embodiments described herein. Any suitable material can be used to form the metallization level in accordance with the embodiments described herein.

The via formed within the redefined opening is disposed on the conductive core of the contact and the conductive plug. Accordingly, the plug can be viewed as an extension of the via formed within the redefined opening.

Further details regarding block 380 are described above with reference to FIG. 9

Having described preferred embodiments of a semiconductor device and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:
    forming a dielectric stack across the base structure by forming a cap layer across the base structure, a second ILD layer on the cap layer, and a sacrificial cap layer on the second ILD layer; and
    forming a patterning stack across the dielectric stack by forming a hardmask layer on the sacrificial cap layer and a dielectric layer on the hardmask layer;
    etching, using the patterning stack, at least one opening and hardmask layer portions, the at least one opening defining a cavity disposed within a first interlayer dielectric (ILD) layer of a base structure adjacent to a contact of the base structure resulting from overetching due to misalignment;
    redefining the cavity into a plug cavity using an etch process that partially removes the hardmask layer portions; and
    forming a conductive plug within the plug cavity to protect underlying material.

2. The method of claim 1, further comprising forming the base structure on an underlying structure, wherein the contact includes a conductive core and conductive liner in contact with the underlying structure.

3. The method of claim 2, wherein etching the at least one opening using the patterning stack further includes:
    etching the patterning stack and the sacrificial cap layer to form dielectric layer portions, the hardmask layer portions, and at least one sub-opening exposing the second ILD layer;
    forming a planarization layer after the at least one sub-opening is formed;
    etching through the at least one sub-opening using the planarization layer to expose the sacrificial layer;
    removing remaining portions of the planarization layer after exposing the sacrificial layer; and
    etching through the sacrificial cap layer to form the at least one opening.

4. The method of claim 1, wherein forming the conductive plug further includes:
    conformally depositing a second conductive liner along exposed surfaces and within the plug cavity; and
    removing portions of the second conductive liner to form the conductive plug in the plug cavity using isotropic etching.

5. The method of claim 1, wherein the hardmask layer includes titanium nitride and the dielectric layer includes silicon dioxide.

6. The method of claim 1, further comprising forming a metallization level after the conductive plug is formed, including:
    removing the hardmask layer portions and the sacrificial cap layer; and
    filling the opening with conductive material.

7. The method of claim 6, wherein the conductive material includes a conductive line and a self-aligned via underneath the conductive line, and wherein the conductive plug provides increased connectivity between the self-aligned via and the contact.

8. A method for fabricating a semiconductor device, comprising:
    etching, using a patterning stack including a hardmask layer, a first opening and a second opening and hardmask layer portions, the first opening defining a cavity disposed within a first interlayer dielectric (ILD) layer of a base structure adjacent to a contact of the base structure resulting from overetching due to misalignment;
    redefining the cavity into a plug cavity using an etch process that partially removes the hardmask layer portions;
    conformally depositing a second conductive liner along exposed surfaces and within the plug cavity;
    removing portions of the second conductive liner to form a conductive plug in the plug cavity to protect underlying material; and
    forming a metallization level after the conductive plug is formed by removing the hardmask layer portions, and filling the first and second openings with conductive material.

9. The method of claim 8, further comprising forming the base structure on an underlying structure, wherein the contact includes a conductive core and conductive liner in contact with the underlying structure.

10. The method of claim 8, further comprising:
    forming a dielectric stack across the base structure by forming a cap layer across the base structure, a second ILD layer on the cap layer, and a sacrificial cap layer on the second ILD layer; and
    forming the patterning stack across the dielectric stack by forming the hardmask layer on the sacrificial cap layer and a dielectric layer on the hardmask layer;
    wherein the conductive material filling the second opening is within the second ILD layer.

11. The method of claim 10, wherein etching the first and second openings using the patterning stack further includes:
    etching the patterning stack and the sacrificial cap layer to form dielectric portions, the hardmask layer portions, and a first sub-opening and a second sub-opening each exposing the second ILD layer;
    forming a planarization layer after the first and second sub-openings are formed;
    etching through the first sub-opening using the planarization layer while the second sub-opening is filled with the planarization layer to expose the sacrificial layer;
    removing remaining portions of the planarization layer after exposing the sacrificial layer; and
    etching through the sacrificial cap layer to form the first and second openings.

12. The method of claim 8, wherein removing the portions of the second conductive liner to form the conductive plug further includes using isotropic etching.

13. The method of claim 8, wherein the hardmask layer includes titanium nitride and the dielectric layer includes silicon dioxide.

14. The method of claim 8, wherein the conductive material in the first opening includes a conductive line and a self-aligned via disposed on the conductive core and the conductive plug underneath the conductive line, and wherein the conductive plug provides increased connectivity between the self-aligned via and the contact.

15. The method of claim 8, wherein the conductive material in the second opening includes a conductive line.

* * * * *